US011856343B2

United States Patent
Holzapfel et al.

(10) Patent No.: US 11,856,343 B2
(45) Date of Patent: Dec. 26, 2023

(54) MONITORING OF HIGH-VOLTAGE OR MEDIUM-VOLTAGE EQUIPMENT

(71) Applicant: Siemens Energy Global GmbH & Co. KG, Munich (DE)

(72) Inventors: Johann Holzapfel, Staatz-Kautendorf (AT); Alexander Rentschler, Bensheim (DE); Christian Wallner, Erlangen (DE); Uwe Weigt, Erlangen (DE); Florian Schirrmacher, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 717 days.

(21) Appl. No.: 16/971,990

(22) PCT Filed: Feb. 26, 2018

(86) PCT No.: PCT/EP2018/054659
§ 371 (c)(1),
(2) Date: Aug. 21, 2020

(87) PCT Pub. No.: WO2019/161929
PCT Pub. Date: Aug. 29, 2019

(65) Prior Publication Data
US 2021/0003634 A1    Jan. 7, 2021

(51) Int. Cl.
*G01R 31/327* (2006.01)
*H04Q 9/00* (2006.01)
*H02J 13/00* (2006.01)

(52) U.S. Cl.
CPC .......... *H04Q 9/00* (2013.01); *G01R 31/3274* (2013.01); *H02J 13/00002* (2020.01);
(Continued)

(58) Field of Classification Search
CPC ................ H04Q 9/00; H04Q 2209/40; H04Q 2209/886; G01R 31/3274; H02J 13/00002;
(Continued)

(56) References Cited

U.S. PATENT DOCUMENTS 9,426,544 B1 *   8/2016   Sim ........................ H04Q 9/00
2008/0218148 A1  9/2008   Robertson et al.
(Continued)

FOREIGN PATENT DOCUMENTS

CN    101464488 A    6/2009
CN    104819744 A    8/2015
(Continued)

OTHER PUBLICATIONS

Balsamo et al., "A new non-invasive voltage measurement method for wireless analysis of electrical parameters and power quality," Sensors, 2013 IEEE, Baltimore, MD, USA, 2013, pp. 1-4, doi: 10.1109/ICSENS.2013.6688560 (Year: 2013).*
(Continued)

*Primary Examiner* — Tung X Nguyen
*Assistant Examiner* — Robert P Alejnikov, Jr.
(74) *Attorney, Agent, or Firm* — Laurence A. Greenberg; Werner H. Stemer; Ralph E. Locher

(57) ABSTRACT

A device for high-voltage or medium-voltage technology includes at least one connection configured for connection to a high-voltage or medium-voltage conductor; a sensor system configured to determine a plurality of different physical and/or chemical measurement values relating to the device and/or the conductor and/or the surroundings; and a communication system, in particular a wireless system, configured to receive the measurement values from the sensor
(Continued)

system and to transmit them to an entity in a network. A method for high-voltage or medium-voltage technology is also provided.

13 Claims, 3 Drawing Sheets

(52) U.S. Cl.
CPC .. *H02J 13/00022* (2020.01); *H02J 13/00026* (2020.01); *H04Q 2209/40* (2013.01); *H04Q 2209/886* (2013.01)

(58) Field of Classification Search
CPC .......... H02J 13/00022; H02J 13/00026; Y02E 60/00; Y04S 10/30; Y04S 40/126
USPC ..................................... 324/424; 702/57, 64
See application file for complete search history.

(56) References Cited

U.S. PATENT DOCUMENTS

| | | | |
|---|---|---|---|
| 2016/0080553 A1 | 3/2016 | Dempster et al. | |
| 2017/0048598 A1 | 2/2017 | Foster et al. | |
| 2017/0084598 A1* | 3/2017 | Choi | H01L 21/823807 |
| 2017/0241362 A1* | 8/2017 | Beerens | F02D 35/02 |

FOREIGN PATENT DOCUMENTS

| | | |
|---|---|---|
| CN | 105302087 A | 2/2016 |
| CN | 205843845 U | 12/2016 |
| EP | 0231909 A2 | 8/1987 |
| EP | 2903297 A1 | 8/2015 |

OTHER PUBLICATIONS

Meijer et al., "Advanced Partial Discharge Measuring System for Simultaneous Testing of Cable Accessories," 2006 IEEE 8th International Conference on Properties & applications of Dielectric Materials, Bali, Indonesia, 2006, pp. 687-690, doi: 10.1109/ICPADM.2006.284270 (Year: 2006).*

Toma et al., "Self-powered high-rate Wireless Sensor Network for Underground High Voltage Power Lines," 2012 IEEE International Instrumentation and Measurement Technology Conference Proceedings, Graz, Austria, 2012, pp. 1881-1885, doi: 10.1109/I2MTC.2012.6229160 (Year: 2012).*

Harid et al., "A Wireless System for Monitoring Leakage Current in Electrical Substation Equipment," in IEEE Access, vol. 4, pp. 2965-2975, 2016, doi: 10.1109/ACCESS.2016.2577553 (Year: 2016).*

* cited by examiner

MONITORING OF HIGH-VOLTAGE OR MEDIUM-VOLTAGE EQUIPMENT

BACKGROUND OF THE INVENTION

Field of the Invention

The present invention relates to a device for high-voltage or medium-voltage technology, and furthermore relates to a method for high-voltage or medium-voltage technology, in particular a product life cycle and/or a production process or/and operation of equipment for high-voltage or medium-voltage technology being monitored.

A switchgear apparatus in high-voltage or medium-voltage technology is an apparatus in which electrical energy can be distributed or transformed. Switchgear apparatuses, in particular their busbars, can form nodes of high-voltage, medium-voltage or low-voltage grids. The incoming and outgoing lines at the node in the switchgear apparatuses can be referred to as branch junctions, which can be designed for infeeds, outgoers and couplings to other grid nodes. The branch junctions of a switchgear apparatus can be connected to other grid nodes via switching devices. The switching devices can comprise e.g. power transistors, power switches, etc. The switchgear apparatus itself can be installed in a closed building and also be embodied as an outdoor installation, e.g. can be designed as one or more switchgear cells. For reliable operation, the various components of the switchgear apparatus have to be monitored.

In particular, information which, on the one hand, is known and accessible and, on the other hand, is not accessible and is thus unknown can arise over the product life cycle of a device appertaining to high-voltage or medium-voltage technology. Known information includes e.g. required quality inspections, which are logged and stored. Unknown information includes e.g. ambient stresses, e.g. accelerations, temperature, torques, compressive stresses, or the residence duration under certain ambient conditions. The information arises at different phases of the life cycle of the device. Conventionally it is not possible to assign the state of a device appertaining to high-voltage or medium-voltage technology to its life cycle.

Quality assurance of devices appertaining to high-voltage or medium-voltage technology is conventionally effected at predefined test times. The product-relevant information during production is determined in test areas provided, e.g. in test cells/test laboratories. The data are determined and acquired therein and ascribed to the object under test by test station devices. From transport to the construction site, transport stresses can be monitored by means of shock indicators on transport assemblies. During start-up, relevant information is acquired by means of test devices and the sensor technology provided is connected to the local system for operation. It is thus not conventional practice to effect continuous data acquisition that could be used for quality and function monitoring.

In a manner governed by technology, in the area of high-voltage and medium-voltage apparatuses, the process data of the apparatuses are acquired with the aid of transducer sensors. Said data (e.g. current, voltage, temperature, pressure, acceleration (vibration), moisture, etc.) are transferred to a superordinate evaluation system in a wired manner. The transducers and sensors are also supplied in a wired manner. The evaluation system has to be parameterized separately for each specific application. The data acquired can be used only by way of further secondary systems.

Measurement data such as current, voltage, temperature, pressure, acceleration (vibration), moisture, etc. are conventionally measured by means of a sensor/transducer. Depending on the measurement value, the latter is subsequently communicated to a superordinate control-protection device in a wired manner by cable. This necessitates configuring, laying and testing copper and fiber-optic cables through the apparatus.

Consequently, the monitoring of equipment for high-voltage or medium-voltage technology in accordance with the prior art is complicated and requires complex cabling. This applies either to a production process, an assembly process or else during normal operation of a fully installed switchgear apparatus.

SUMMARY OF THE INVENTION

It is thus an object of the present invention to provide a device and respectively a method for high-voltage or medium-voltage technology, wherein at least some of the disadvantages or problems observed in the prior art are reduced or even eliminated.

In accordance with one embodiment of the present invention, a device for high-voltage or medium-voltage technology is provided, comprising: at least one connection designed for being connected to a high-voltage or medium-voltage conductor, in particular cable and/or gas-insulated conductor and/or overhead line conductor; a sensor system designed to determine a plurality of different physical and/or chemical measurement values relating to the device and/or the cable and/or the surroundings; a communication system, operating in particular wirelessly, which is designed to receive the measurement values from the sensor system and to transmit them to an entity in a network.

The device can comprise, in particular, a switchgear apparatus designed for distributing or transforming energy in a medium-voltage grid or high-voltage grid. The at least one connection designed for being connected to a high-voltage or medium-voltage cable can implement a branch junction designed for infeed and/or output of electrical energy or coupling to other grid nodes.

The sensor system can comprise one or more sensors arranged at different locations of the device, in particular arranged at different components of the device, in order to determine the physical and/or chemical measurement values. The device can comprise a plurality of (electrical and/or electronic) components regarding which the measurement values can be determined by means of the sensor system. The sensor system can also detect measurement values relating to an electrical energy (e.g. current and voltage) carried in the cable. Measurement values relating to the surroundings can relate to conditions around the device, e.g. weather conditions, temperature, pressure, moisture, etc. The sensor system can thus enable comprehensive monitoring of the device.

The communication system can comprise one or more modules (which e.g. can also be integrated in the sensors) and can be communicatively connected either unidirectionally or bidirectionally to all the sensors of the sensor system. The measurement values of the sensors of the sensor system can be transmitted in particular by radio transmission, i.e. wirelessly to the communication system and/or wirelessly to the entity by means of the communication system. The communication system can be connected in a wired manner or wirelessly to a communication network in which the entity (e.g. a server with a database) is situated. The communication system can thus communicate partly wirelessly and partly in a wired manner.

The sensor system can be designed to operate autonomously, in particular not to require a specially provided energy supply system. A simply constructed device for high-voltage or medium-voltage technology can thus be provided which enables monitoring in different life phases, e.g. production, transport, installation and/or operation.

In accordance with one embodiment of the present invention, the communication system is designed to allow bidirectional communication so as to obtain sensor configuration data and to communicate them to the sensor system, said data configuring the sensor system in particular with regard to protection function and/or measurement function and/or sensitivity and/or sampling rate. The communication system can be designed to obtain control data and to transmit them to components of the device in order to control operation of the device. The communication system can be designed to transmit protection control data to components of the device in order to control protection functions of the device.

The sensor configuration data can allow the various sensors of the sensor system to be configured, in particular with regard to the measurements to be carried out, e.g. measurement times, sampling intervals, measurement amplifications, etc. The communication system can obtain e.g. control data from an entity (e.g. server) from the network, which control data were provided or generated e.g. by an operator of the device. The control data can comprise e.g. control signals to components of the device for driving so as to establish or to interrupt e.g. specific connections to the at least one high-voltage or medium-voltage conductor (e.g. by means of power switches and/or power transistors). The protection functions of the components can be designed to protect the device against damage or else to protect the connection against damage or impairment.

In accordance with one embodiment of the present invention, the device furthermore comprises a preprocessing system in order to prepare the measurement values for transmission, in particular to digitize them and/or to provide them with identification data and/or a time stamp and/or to convert them into at least one transmission data packet.

The sensors of the sensor system can be designed in various ways and provide the measurement values in respectively specific formats. The preprocessing system can convert these different formats or manners of representation into a uniform format, and in particular convert them into a uniform transmission data format, so as, in particular wirelessly, to transmit one uniform transmission data packet or a plurality of transmission data packets for each sensor of the sensor system to the communication system and/or to the entity by means of the communication system. In particular, the communication system can comprise a wireless transmission module for each sensor of the sensor system in order to transmit the respective measurement values from the respective sensor of the sensor system to the entity. By way of example, the type of sensor, the significance of the measurement value, the measurement time, the sampling rate, the sensitivity, etc. can be specified in the transmission data packet.

In accordance with one embodiment of the present invention, the measurement values relate to location data and/or acceleration and/or temperature and/or torque and/or compressive stress and/or residence duration of the device.

Alternatively or additionally, in accordance with one embodiment of the present invention, the measurement values relate to current and/or voltage and/or temperature and/or pressure and/or acceleration and/or vibration and/or moisture of the electrical conductor (e.g. via a connected cable, a connected overhead line or a gas-insulated connection) connected to the device.

Comprehensive monitoring of the device can thus be made possible. Quality assurance or reliable operation of the device can thus be ensured.

In accordance with one embodiment of the present invention, the communication system is designed to autonomously make itself known and/or log on to the entity, in particular a database (or a server), and/or in the network. The communication system can be a central communication system that obtains the corresponding measurement values from all the sensors of the sensor system. In other embodiments, separate communication modules of all the sensors of the sensor system jointly form the communication system. In this case, the communication modules of all the sensors of the sensor system can transmit their respective measurement data (separately) to the entity in the network, in particular wirelessly. In this case, the communication modules of all the sensors of the sensor system can also be designed to autonomously make themselves known and/or log on to the entity in order to initiate a communication session.

In accordance with one embodiment of the present invention, the sensor system is designed to operate autonomously (e.g. without (cable-based) aid or assistance from outside, in particular without a cable connection toward the outside) by obtaining the energy necessary for operation wirelessly, in particular by inductive transmission (e.g. from a nearby component) or an included battery/rechargeable battery, and/or by way of converted waste heat. In particular, the sensor system thus need not be connected to an energy supply by means of an electrical energy supply cable. In particular, each individual sensor of the sensor system can be designed to operate autonomously. Therefore, a complexity of the device can be reduced and, in particular, an installation outlay of the sensor system can be reduced.

In accordance with one embodiment of the present invention, the entity is designed to monitor a manufacturing process and/or transport and/or assembly of the device and/or to optimize operation and/or the product and/or to carry out quality assurance.

The sensor system together with the communication system is thus usable for monitoring in diverse ways in various life phases of the device.

In particular, the device can comprise a switchgear apparatus in the high-voltage or medium-voltage range.

It should be understood that features that are described, explained or provided individually or in any combination in association with a device for high-voltage or medium-voltage technology can be applied, equally or with appropriate modification, individually or in any combination for a method for high-voltage or medium-voltage technology, and vice-versa, in accordance with embodiments of the present invention.

In accordance with one embodiment of the present invention, a method for high-voltage or medium-voltage technology is provided, comprising: providing a device having a connection designed for being connected to a high-voltage or medium-voltage conductor; determining a plurality of different physical and/or chemical measurement values relating to the device and/or the conductor and/or the surroundings; transmitting, in particular wirelessly, the measurement values to an entity in a network.

In accordance with one embodiment of the present invention, the method is carried out during production and/or transport and/or assembly and/or operation and/or maintenance of the device.

Embodiments of the present invention will now be explained with reference to the accompanying drawings. The invention is not restricted to the embodiments illustrated or described.

DETAILED DESCRIPTION OF THE INVENTION

Figure 1:
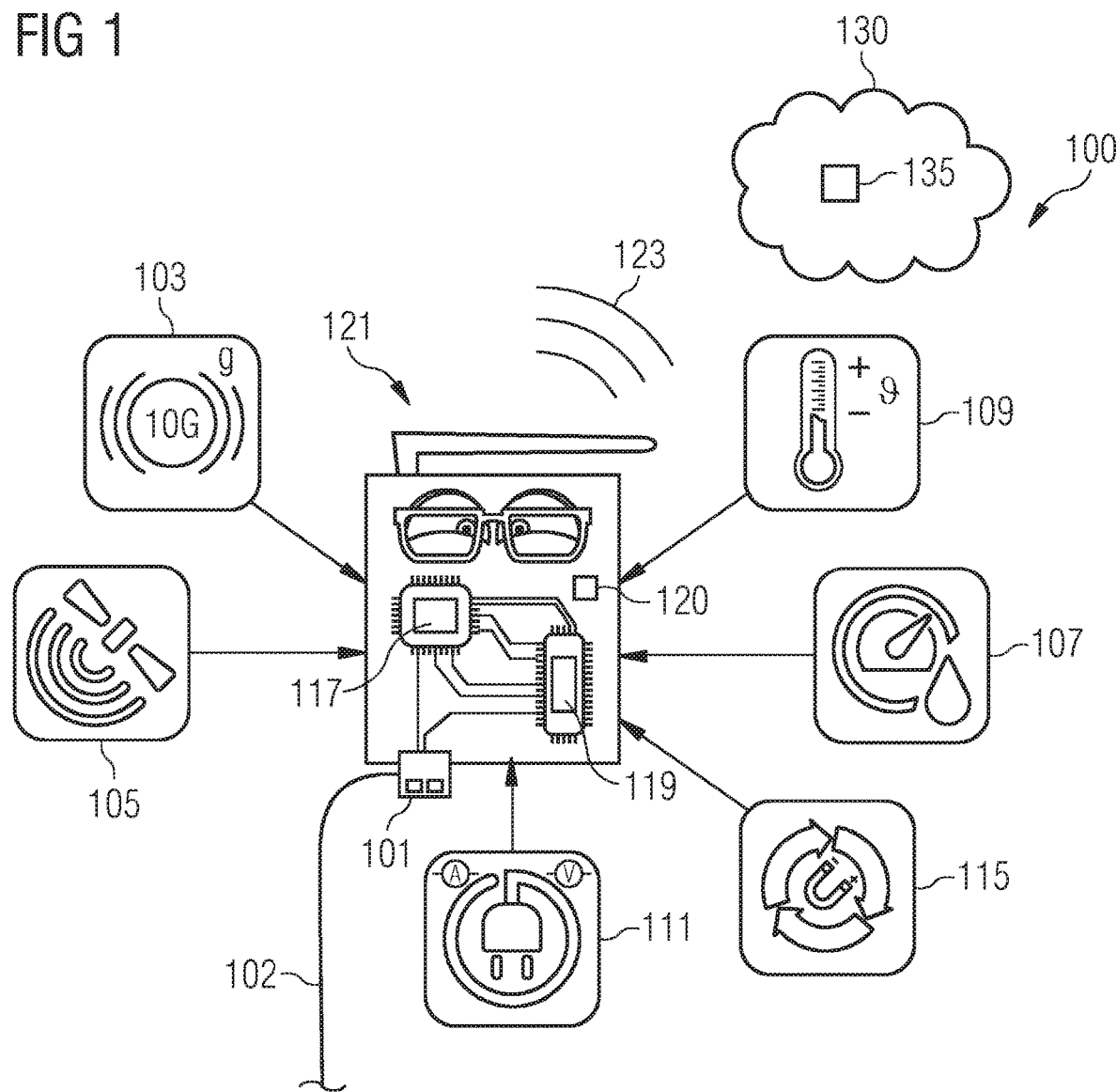
FIG. 1 schematically illustrates a device for high-voltage or medium-voltage technology in accordance with one embodiment of the present invention (also referred to as sensor system)

Similar or identical structures or features are designated by reference signs that differ only in the first digit. Features of different embodiments can be combined.

In accordance with one embodiment of the present invention, a device comprises multi-functional sensor technology. The multi-functional sensor technology (also referred to hereinafter as sensor system) continuously collects all relevant information, processes it and can store it autonomously in a database (cloud) (e.g. an entity, in particular a computer server). Since GPS data, acceleration values and temperature profiles are stored, inter alia, the entire process for producing the device can be checked for deviations. By way of example, in the manufacturing process, vibrations of manufacturing machines can be detected by means of an acceleration-time profile. Furthermore, sequences in the transport process can be detected, wherein transport loadings can be signaled by autonomous systems. In this case, excessive stresses can be detected promptly and measures can immediately be initiated to counteract the excessive stresses.

Furthermore, during assembly and/or start-up, information can be collected by means of the sensor system. Generally, sensors of the sensor system can independently log on or make themselves known in the local network. Furthermore, sensors of the sensor system which are assigned to individual devices can communicate and exchange relevant information with one another. Furthermore, it is possible to effect monitoring during operation and/or maintenance by means of the sensor system and the communication system, wherein the operational management can be optimized on the basis of the operating state of the individual components.

In accordance with embodiments of the present invention, it is possible to carry out continuous monitoring of the product life cycle of the components of the device for high-voltage or medium-voltage technology. The product-relevant data can be stored by an autonomous sensor unit in a superordinate database (cloud) and can be processed further by diverse evaluation applications. In this case, manufacturing processes can be monitored, transport and assembly monitoring can be carried out, operational optimization can be carried out, product optimization can be carried out and quality assurance can be carried out.

The sensors of the sensor system can be able to detect not only operationally governed variables (e.g. temperature, voltage, current, gas density) but also data relevant to the life cycle (e.g. acceleration, vibration, moisture, GPS data). The sensor unit can operate continuously and autonomously and can be able to transmit relevant data for further use into a database, for which purpose the communication system can be used. The sensor unit (e.g. via the communication system of distributed or central design) can independently log on to the local network at the construction site and exchange the relevant data during assembly/start-up in order to document quality assurance.

The entire life cycle of the product can be monitored continuously. As a result, improvements in production can be achieved, costs of mistakes can be reduced and operational management can be optimized.

In accordance with other embodiments of the present invention, the sensor system is used for monitoring operation of the device for high-voltage or medium-voltage technology. In this case, the autonomously functioning sensor unit can continuously collect all relevant measurement values, process (e.g. digitize) them and autonomously and wirelessly transmit them or process them further (e.g. convert them into derived values, use them for internal processing algorithms . . . ). The data flow can also be effected bidirectionally and thus enables the sensor parameters of the sensors of the sensor system to be changed. For example, a switchover from a protection function to a measurement function during current measurement can be effected, an accuracy class adaptation can be effected, a data sampling rate can be set, etc.

A sensor can be assigned to a component of the device and (e.g. via the communication system or a module thereof assigned to the sensor) can autonomously log on to an apparatus database (plug+play). Required information can be stored directly in the database. The data can be preprocessed (in particular by means of a preprocessing system) in the sensor to an extent such that the algorithms in the database can implement higher-level functions (e.g. protection and monitoring). Additional hardware can be dispensed with, by virtue of "protection in the cloud". Individual functions (e.g. backup protection, comparison value detection, . . . ) are implemented autonomously in the sensor or else by communication (via cloud) directly with one or more component sensors. The signaling or the control command can be issued directly to the relevant component.

Various advantages can be achieved by embodiments of the present invention. For example, cabling can be simplified and/or the laying of cables can be entirely obviated. A saving of devices and reduction of the control and protection cabinets required can be achieved, whereby a space requirement can be reduced. Furthermore, an engineering outlay can be reduced.

The sensor unit can operate continuously and autonomously and be able to transmit relevant data for further use into a database or to exchange them with other sensors. In this case, data can be transmitted by means of wireless plug+play. The sensor can be adapted to existing components and new components can have the sensor unit integrated directly from the factory. In alternative embodiments, the data acquisition can be carried out in a decentralized manner without continuous transparency.

FIG. 1 schematically illustrates a device 100 for high-voltage or medium-voltage technology in accordance with one embodiment of the present invention. The device 100 illustrated in FIG. 1 comprises at least one connection 101 designed for being connected to a high-voltage or medium-voltage conductor 102 in order thus to implement a branch junction. The device 100 furthermore comprises a sensor system consisting of a plurality of sensors 103, 105, 107, 109, 111, 115, which is designed to determine a plurality of different physical and/or chemical measurement values relating to the device 100 and/or to determine physical and/or chemical measurement values relating to an electrical conductor connected to the connection 101, e.g. cable or gas-insulated conductor or overhead line conductor, and/or to determine physical and/or chemical measurement values relating to the surroundings. In particular, the sensor 103 is designed for determining accelerations, the sensor 105 is designed for determining a position (via GPS), the sensor 107 is designed for determining a moisture, and the sensor 109 is designed for determining the temperature. The sensor 111 can be designed for determining current and voltage and the sensor 115 can be designed for determining magnetic fluxes which are present on a cable connected to the connection 101.

The device can comprise various components 117, 119 that are used for evaluating/detecting/controlling measurement values and enable normal operation of the device, which can be designed e.g. as a switchgear apparatus. The sensors can respectively be assigned to one or more components 117, 119.

The device 100 furthermore has a wireless communication system 121 designed to obtain the measurement values from the sensors 103, 105, 107, 109, 111, 115 and to transmit them in particular wirelessly to an entity 135 in a network 130, in particular after conditioning by a preprocessing system 120. The measurement values can thus be transmitted to the entity 135 by way of radio waves 123.

Consequently, the data can be acquired and sent wirelessly to a superordinate system. In this case, the communication system 121 can itself autonomously log on in a cloud (e.g. network 130) (e.g. WLAN plug+play). Furthermore, the sensor system and/or the communication system 121 can have an autonomous supply, in particular energy supply. Furthermore, the sensor system and/or the communication system can preprocess the measurement values, in particular the measurement data, to an extent such that the data can be used in the cloud (in particular by the entity, e.g. a computer server, 135). A simple basic configuration (component addressing, . . . ) can be realized by means of MLFB (e.g. with a DIP switch). A bidirectional data flow can be effected between the communication system 121 and the entity 135 and/or the sensors in order e.g. to enable a switchover from protection function to measurement function during current measurement, to enable an accuracy class adaptation, to set a data sampling rate, etc. The sensor system can autonomously implement individual functions (e.g. backup protection, comparison value detection, . . . ) or else carry them out by communication directly with one or more component sensors. The device can furthermore perform signaling and control of its associated components.

Figure 2:
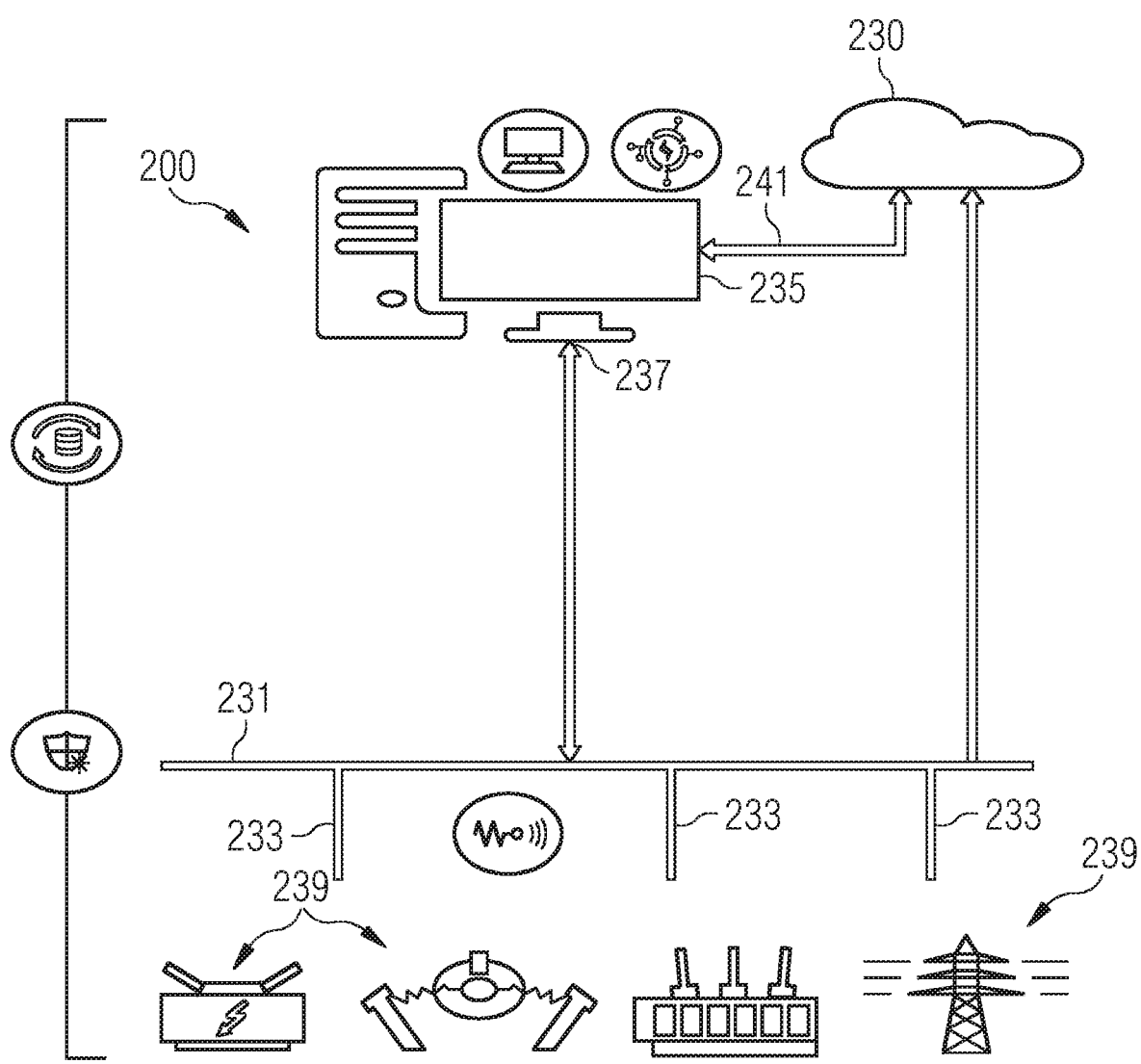
FIG. 2 schematically illustrates a system (comprising network, database, server) for high-voltage or medium-voltage technology, which system comprises a device for high-voltage or medium-voltage technology in accordance with one embodiment of the present invention.

FIG. 2 schematically illustrates a device 200 in accordance with one embodiment of the present invention, which is connected to a network 230 (e.g. connected to a cloud). The device 200 comprises a communication system 231 having a number of branches 233 enabling connection to equipment components 239. Furthermore, the equipment components 239 comprise sensors that can be monitored in accordance with embodiments of the present invention by means of a sensor system, not illustrated in detail. The measurement values of the sensor system are communicated as measurement signals 237 to a control and monitoring unit 235 (corresponds to the entity 135 in a network in FIG. 1), which is equipped with or connected to a communication system, not illustrated in detail. The control and monitoring unit 235 is connected to the network 230 (e.g. the Internet or a data lake) via a communication link 241 (wireless or wired). The communication system is designed to receive the measurement values from the sensor system and to transmit them to the entity 235 in the network 230.

The sensors of the sensor system can obtain energy from their environment as supply energy (e.g. induction in the HV devices, converted waste heat, etc.). The sensors of the sensor system can independently make themselves known to a surrounding network (e.g. wireless network) and can signal e.g. which components is being monitored and what type of data is being sent. In a superordinate cloud, the measurement data or measurement values obtained from the sensors can be processed by algorithms being executed which the sensor itself can no longer handle or which are acquired from other stations. Time-critical functions can/ought to be transmitted directly from the detecting sensor to the implementing sensor.

Figure 3:
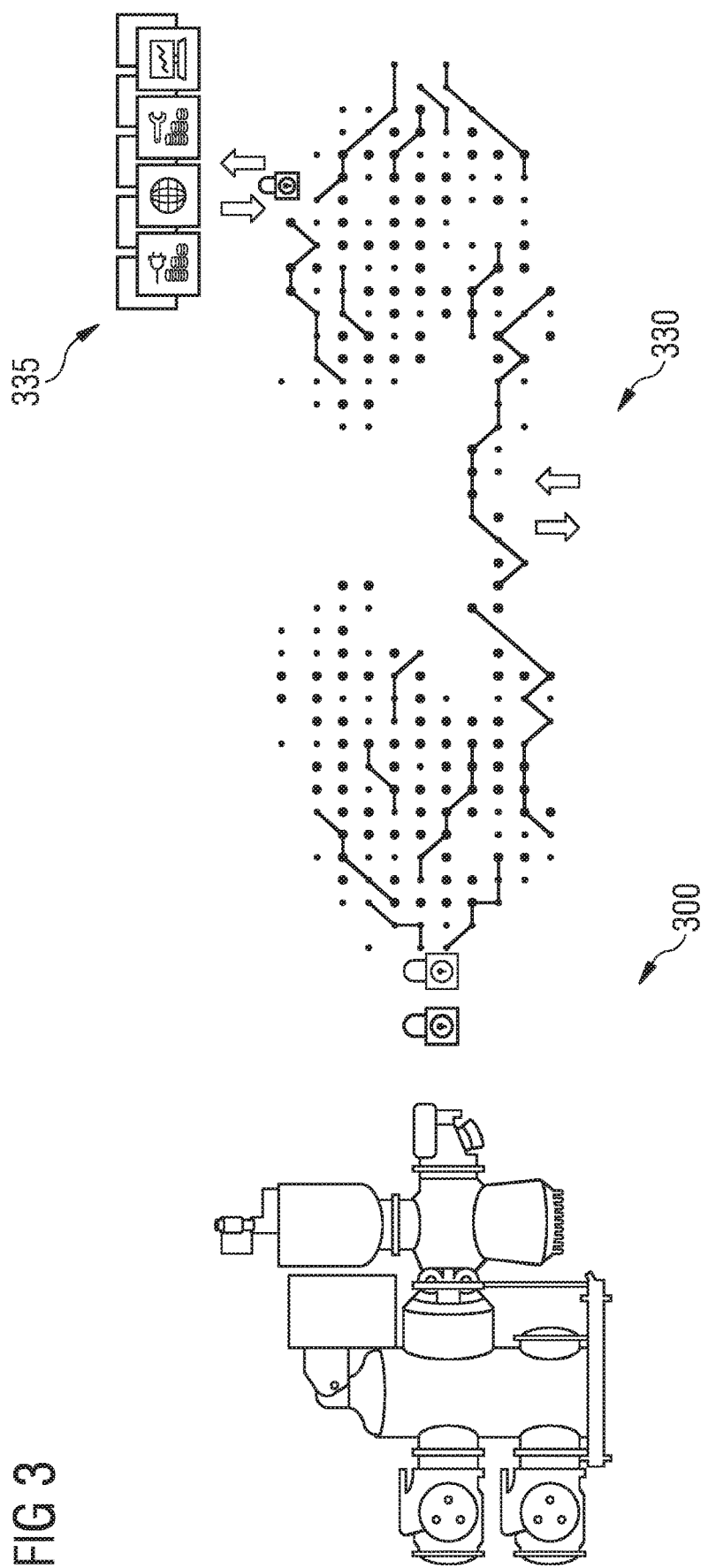
FIG. 3 schematically illustrates a system for high-voltage or medium-voltage technology, which system comprises a device for high-voltage or medium-voltage technology in accordance with another embodiment of the present invention.

FIG. 3 schematically illustrates a further device 300 in accordance with one embodiment of the present invention, which is connected to a network 330. The device 300 can be designed as a switchgear apparatus, for example, and comprises a sensor system and also a communication system, which can be connected to the network 330 communicatively by way of encryption functions. An entity 335 is arranged within the network 330, which entity can contain a database, for example, to which the measurement values obtained in the device 300 are transmitted.

The invention claimed is:

1. A device for high-voltage or medium-voltage technology, the device comprising:
   at least one connection configured to be connected to a high-voltage or medium-voltage conductor being at least one of a cable or a gas-insulated conductor or an overhead line conductor;
   a sensor system configured to determine a plurality of at least one of different physical or chemical measurement values relating to at least one of the device or the conductor or the surroundings; and
   a wirelessly operated communication system configured to receive the measurement values from said sensor system and to transmit the measurement values to an entity in a network, said wirelessly operated communication system being configured to allow bidirectional communication in order to:
      obtain sensor configuration data and communicate the sensor configuration data to said sensor system, and
      obtain control data and transmit the control data to components of the device in order to control operation of the device, and
      transmit protection control data to components of the device in order to control protection functions of the device.

2. The device according to claim 1, wherein the sensor configuration data configures said sensor system with regard to at least one of a protection function or a measurement function or a sensitivity or a sampling rate.

3. The device according to claim 1, which further comprises a preprocessing system for preparing the measurement values for transmission.

4. The device according to claim 3, wherein said preprocessing system at least one of digitizes the measurement values or provides the measurement values with at least one of identification data or a time stamp or converts the measurement values into at least one transmission data packet.

5. The device according to claim 1, wherein the measurement values at least one of:
  relate to at least one of:
    location data or
    acceleration or
    temperature or
    torque or
    compressive stress or
    residence duration
  of the device; or
  relate to at least one of:
    current or
    voltage or
    temperature or
    pressure or
    acceleration or
    vibration or
    moisture
  of the conductor connected to the device.

6. The device according to claim 1, wherein said communication system is configured to at least one of autonomously make itself known or log on to at least one of the entity or the network.

7. The device according to claim 6, wherein the entity is a database.

8. The device according to claim 1, wherein said sensor system is configured to operate autonomously by wirelessly obtaining energy required for operation.

9. The device according to claim 8, wherein said sensor system (obtains the energy required for operation by at least one of inductive transmission or converting waste heat.

10. The device according to claim 1, wherein the entity is configured to at least one of:
  monitor a manufacturing process or
  monitor a transport or
  monitor an assembly or
  optimize at least one of an operation or a product or
  carry out quality assurance.

11. The device according to claim 1, wherein the device includes a switchgear apparatus.

12. A method for high-voltage or medium-voltage technology, the method comprising:
  providing a device having a connection configured to be connected to a high-voltage or medium-voltage conductor being at least one of a cable or a gas-insulated conductor or an overhead line conductor;
  using a sensor system to determine a plurality of at least one of different physical or chemical measurement values relating to at least one of the device or the conductor or the surroundings; and
  transmitting the measurement values to an entity in a network by using a wirelessly operated communication system being configured to allow bidirectional communication in order to:
  obtain sensor configuration data and communicate the sensor configuration data to the sensor system, and
  obtain control data and transmit the control data to components of the device in order to control operation of the device, and
  transmit protection control data to components of the device in order to control protection functions of the device.

13. The method according to claim 12, which further comprises carrying out the method during at least one of:
  production or
  transport or
  assembly or
  operation or
  maintenance
of the device.

* * * * *